(12) United States Patent
Yu et al.

(10) Patent No.: US 7,482,192 B2
(45) Date of Patent: Jan. 27, 2009

(54) METHOD OF MAKING DIMPLE STRUCTURE FOR PREVENTION OF MEMS DEVICE STICTION

(75) Inventors: Lianzhong Yu, Redmond, WA (US); Ken L. Yang, Bellevue, WA (US)

(73) Assignee: Honeywell International Inc., Morristown, NJ (US)

( * ) Notice: Subject to any disclaimer, the term of this patent is extended or adjusted under 35 U.S.C. 154(b) by 260 days.

(21) Appl. No.: 11/383,576

(22) Filed: May 16, 2006

(65) Prior Publication Data

US 2007/0269920 A1 Nov. 22, 2007

(51) Int. Cl.
*H01L 21/302* (2006.01)

(52) U.S. Cl. .................. 438/50; 257/415; 257/E29.324; 438/704; 438/712

(58) Field of Classification Search .................... 438/50, 438/52, 628, 644, 654; 257/E21.396, 415, 257/753, E23.16, E29.324, E21.613, E21.584
See application file for complete search history.

(56) References Cited

U.S. PATENT DOCUMENTS

| | | | |
|---|---|---|---|
| 5,723,353 A * | 3/1998 | Muenzel et al. ............... 438/48 |
| 6,243,474 B1 * | 6/2001 | Tai et al. ...................... 381/174 |
| 6,538,798 B2 | 3/2003 | Miller et al. | |
| 6,876,046 B2 | 4/2005 | Prophet | |
| 2003/0146464 A1 * | 8/2003 | Prophet ...................... 257/306 |
| 2005/0255645 A1 * | 11/2005 | Lutz et al. ................... 438/202 |
| 2006/0278942 A1 * | 12/2006 | Rubel ......................... 257/415 |

* cited by examiner

*Primary Examiner*—Marcos D. Pizarro
*Assistant Examiner*—Eva Montalvo
(74) *Attorney, Agent, or Firm*—Black Lowe & Graham

(57) ABSTRACT

A MEMS device having a proof mass resiliently mounted above a substrate has projections formed on adjacent surfaces of the mass and substrate. The device is formed by creating a plurality of holes in the upper layer. A substance suitable for removing the intermediate layer without substantially removing the upper layer and substrate is introduced through the holes. A substance removing the upper layer, the substrate, or both, is then introduced through the holes to remove a small amount of the substrate and upper layer. Portions of the intermediate layer between the projections are then removed. The dimple structure fabricated from this process will prevent MEMS device stiction both in its final release and device operation.

20 Claims, 6 Drawing Sheets

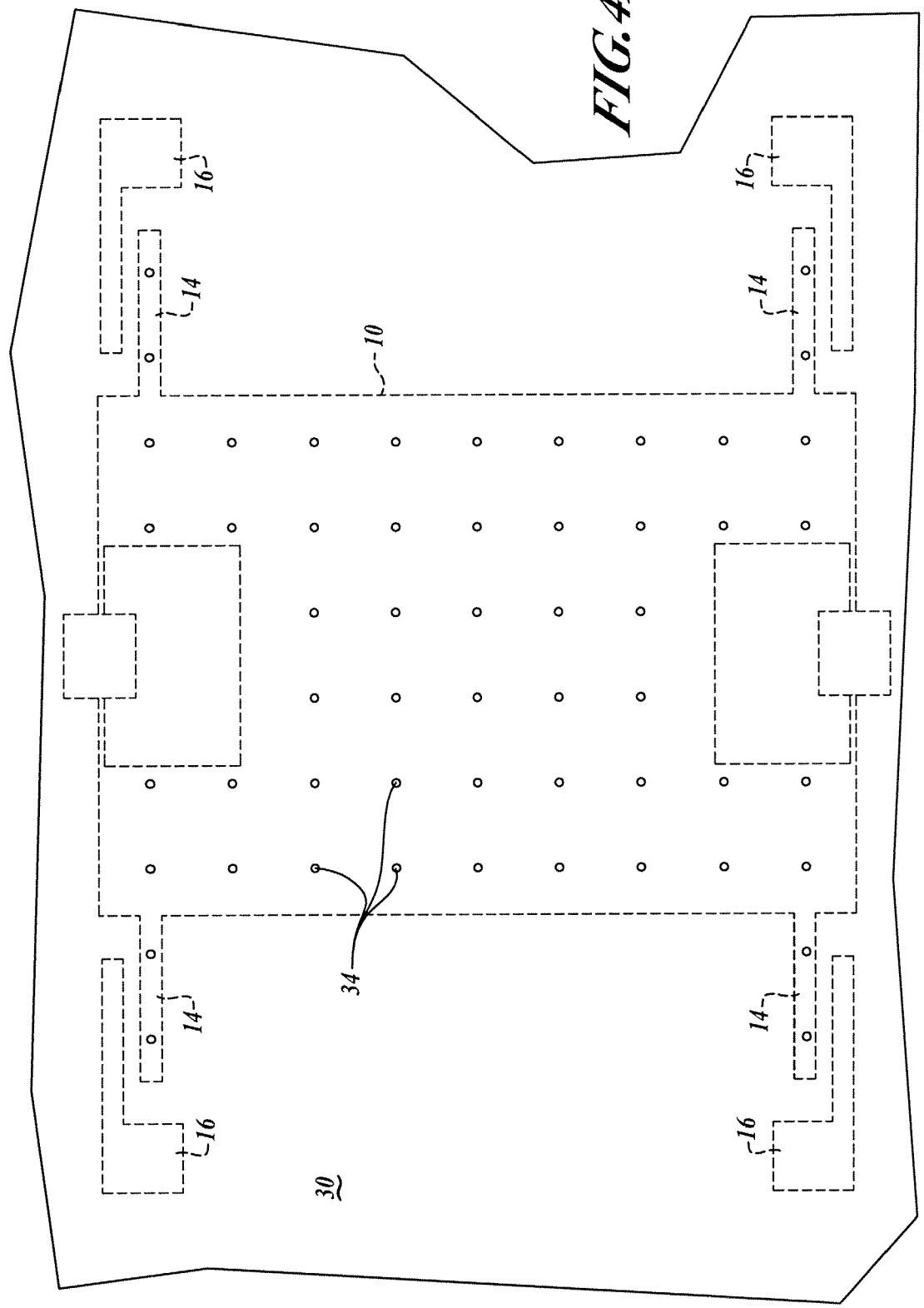

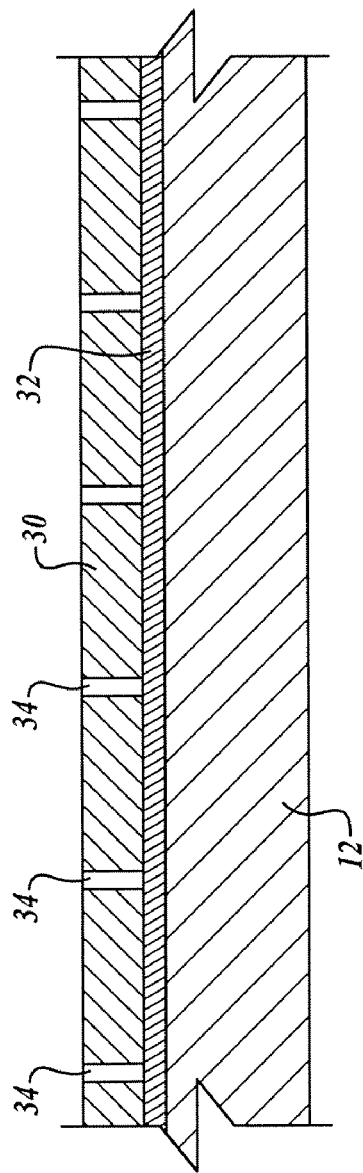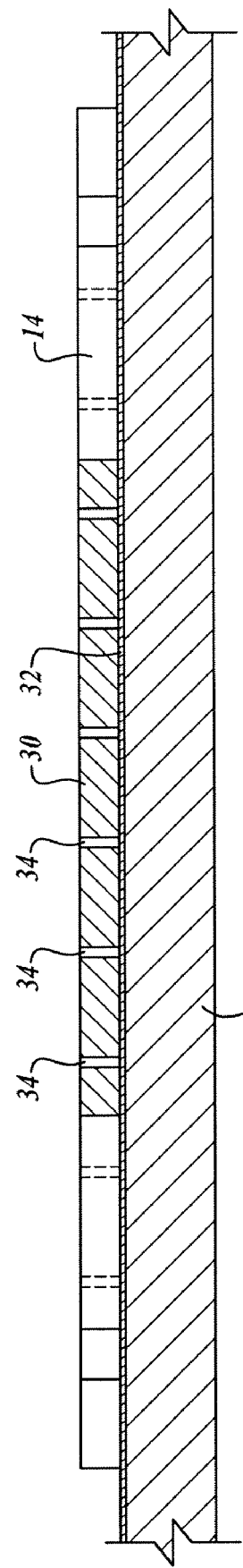

METHOD OF MAKING DIMPLE STRUCTURE FOR PREVENTION OF MEMS DEVICE STICTION

BACKGROUND OF THE INVENTION

Many Micro Electromechanical Systems (MEMS) include a structure, such as shown in FIGS. 1A and 1B, in which a mass 10 is resiliently mounted above a substrate 12. For example, a comb drive is formed on a proof mass 10 elastically mounted to a substrate 12, having a plurality of teeth 14 extending therefrom. Corresponding teeth 16 are rigidly mounted to the substrate and electrically coupled to signal generating and sensing circuits. The capacitance between the teeth 14 of the proof mass 10 and the rigidly mounted teeth 16 is used to sense movement of the mass 10 and to actuate the mass 10.

In such systems, the proof mass 10 is typically a very small distance from the substrate 12. As a result, it is possible for the proof mass 10 to contact the substrate. Because the forces involved are typically extremely small, adhesion between the proof mass 10 and the substrate 12 due to intermolecular forces, such as van der Waals interactions, become significant. The contacting surfaces of the proof mass and substrate are therefore prone to adhere to one another when brought into contact with one another due to a phenomenon known as "stiction." Stiction may cause the mass and substrate to fail to separate during the fabrication process. $CO_2$ drying or other drying methods may be used to release stiction during fabrication. However, stiction can still occur during device operation. Sometimes this stiction is permanent and the device then cannot be recovered. In some cases, stiction during device operation is temporary and can be overcome by inertial forces exerted on the mass 10. However, even where stiction is overcome, measurements derived from the device and movements performed by the device will be subject to errors caused by the temporary adhesion of the proof mass to the substrate.

In view of the foregoing, it would be an advancement in the art to provide a MEMS device not subject to errors caused by stiction.

SUMMARY OF THE INVENTION

A Micro Electromechanical (MEM) device includes a substrate having an upper surface and a mass having a lower surface positioned over the upper surface vertically separated from the upper surface by a small gap. The mass is resiliently mounted to the substrate such that the mass may move relative to the substrate. A lower surface of the mass, the upper surface of the substrate, or both have a plurality of small local projections formed thereon. The height of the projection is typically substantially less than the width of the gap.

The device may be formed in a workpiece having an upper layer, an intermediate layer, and a substrate. The intermediate layer is formed of a material different then that forming the upper layer, the substrate, or both. In one embodiment, the upper layer and substrate are formed of silicon and the intermediate layer is formed of an oxide of silicon.

The device is formed by creating a plurality of holes in the upper layer. A substance suitable for removing the intermediate layer without substantially removing the upper layer and substrate is introduced through the holes to remove a substantial portion, but not the entire intermediate layer, to form isolated areas of material in the intermediate layer. A substance removing the upper layer, the substrate, or both, is then introduced through the holes to remove a small amount of the substrate and upper layer not shielded by the isolated areas of the intermediate layer to create small projections adjacent the isolated areas. Portions of the intermediate layer between the projections are then removed.

BRIEF DESCRIPTION OF THE DRAWINGS

The preferred and alternative embodiments of the present invention are described in detail below with reference to the following drawings:

FIGS. 4A is a top view of an upper layer of the layers of FIG. 3 having a plurality of holes formed therein, in accordance with an embodiment of the present invention;

FIG. 4B is a side cross-sectional view of the device of FIG. 4A;

FIG. 4C is a side cross-sectional view of an upper layer formed into a comb drive having a plurality of holes formed therein, in accordance with an embodiment of the present invention;

DETAILED DESCRIPTION OF THE PREFERRED EMBODIMENT

Figure 1A:
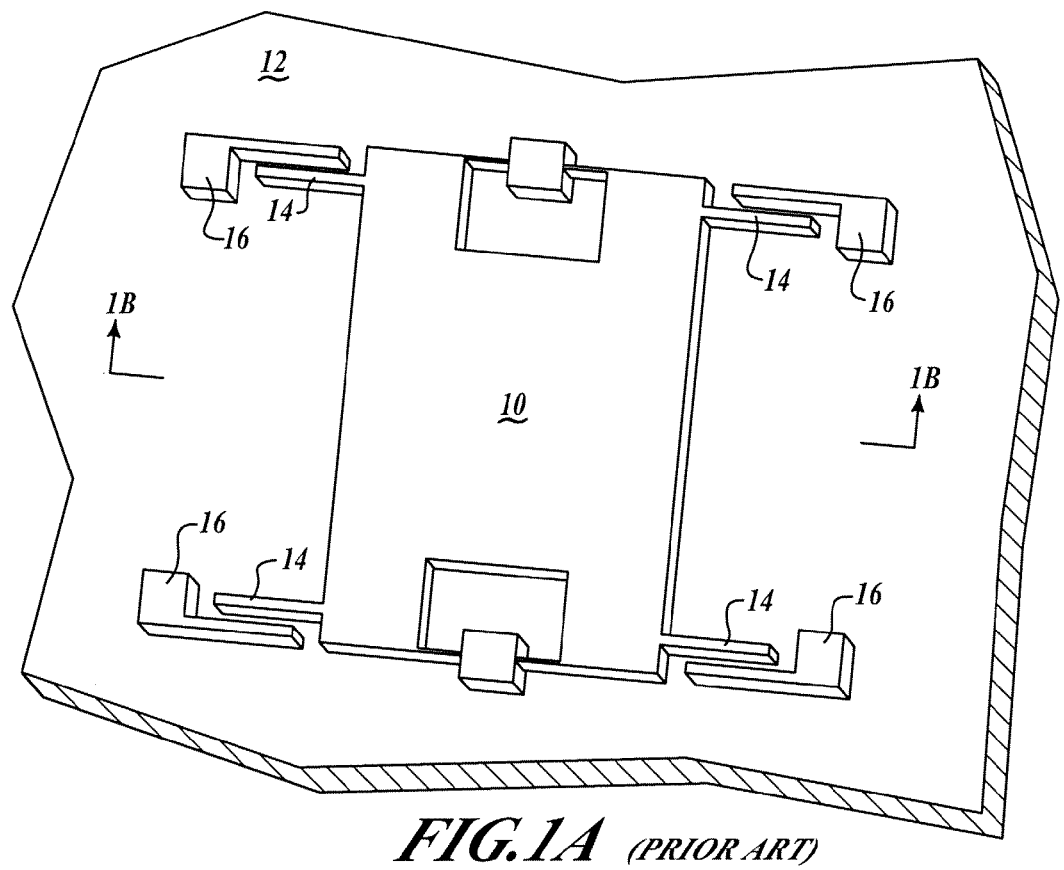
FIG. 1A is a perspective view of comb drive device according to the prior art.
Figure 1B:
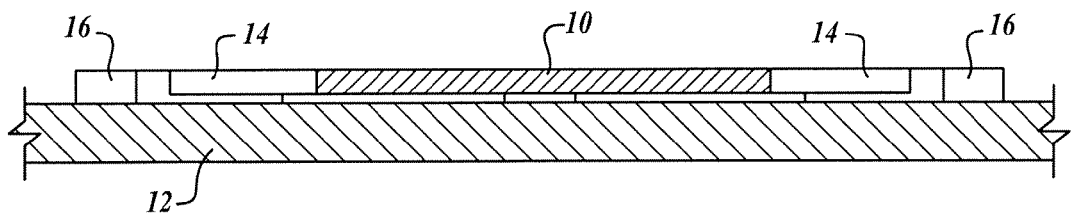
FIG. 1B is a side cross-sectional of a comb drive device according to the prior art.
Figure 2A:
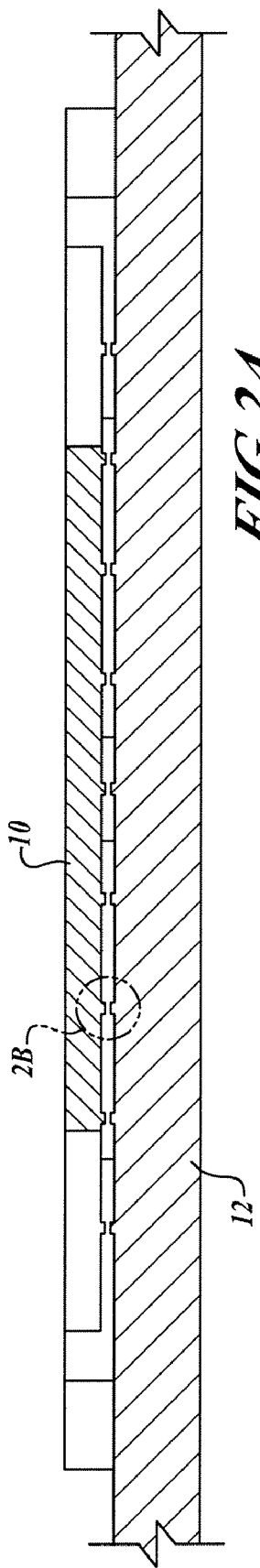
FIGS. 2A and 2B are side cross-sectional views of a comb drive having a plurality of projections formed thereon, in accordance with an embodiment of the present invention.
Figure 2B:
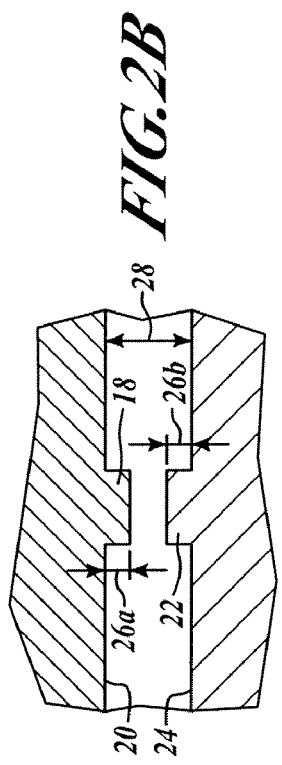

Referring to FIGS. 2A and 2B, in an embodiment of the invention the proof mass 10 is provided with projections 18 on an undersurface 20 thereof. In some embodiments, projections 22 are formed on an upper surface 24 of the substrate 12. The projections 22 may be aligned with the projections 18 or offset therefrom. The projections 18, 22 may be distributed in a regular or random pattern. The projections typically only occupy an insubstantial amount of the local region in which they are formed. For example, the projections may be less than 5% of the area of the local region in one embodiment. In another embodiment, the projections 18, 22 occupy less than 2% of the area of the local region. In yet another embodiment, the projections 18, 22 occupy less than 1% of the local region. The projections 18 may have a height 26a equal to a height 26b of the projections 22. Alternatively the heights 26a, 26b may be unequal. The heights 26a, 26b of the projections 18, 22 are typically much less than the height 28 of the gap between the mass 10 and substrate 12. In one embodiment, the heights 26a, 26b are 5% of the height 28. In another embodiment, the heights 26a, 26b are less than 2% of the height 28. In another embodiment, the heights 26a, 26b are less than 1% of the height 28. The heights 26a, 26b are typically chosen to substantially reduce stiction by reducing the area of the mass 10 and substrate 12 that actually contact each other. The area occupied by the projections 18, 22 is also chosen to reduce stiction.

In the preferred embodiment, the projections 18, 22 occupy 5-10% of the area of the mass, the portion of the substrate 12 located beneath the mass 10, or both, whereas in other areas of the MEMS device, the projections typically occupy less than 2% of the area. In the preferred embodiment, the heights 26a, 26b of the projections 18, 22 are between about 0.2 and 1 μm.

Figure 3:
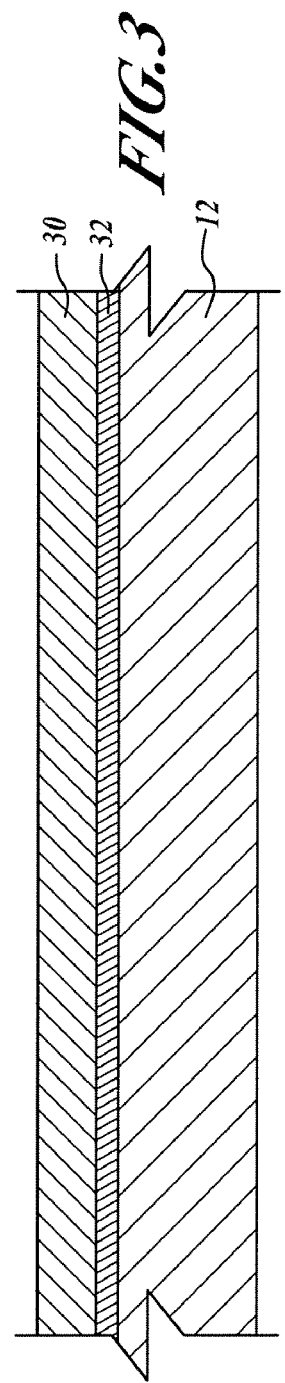
FIG. 3 is a side cross-sectional view of an upper layer, intermediate layer, and substrate suitable for forming a MEMS device having projections formed thereon, in accordance with an embodiment of the present invention.

Referring to FIG. 3, the projections 18, 22 in accordance to the invention may be formed in an upper layer 30 positioned over the substrate 12. An intermediate layer 32 is positioned between the upper layer 30 and the substrate 12. The intermediate layer 32 is typically formed of a different material than the upper layer 30 and substrate 12, such as an oxide of the material forming the substrate 12 or upper layer 30.

In the illustrated embodiment, the upper layer 30 and substrate 12 are formed of silicon and the intermediate layer 32 is silicon oxide. In one embodiment, a silicon-on-insulator (SOI) wafer is used. The intermediate layer 32 is typically much thinner than the upper layer. The thickness of the intermediate layer 32 is typically chosen to be about the same size as, or just slightly smaller than, a gap between the projections 18, 22 of the proof mass 10 and the substrate 12 in the completed device.

Referring to FIGS. 4A-4C, a plurality of holes 34 are then formed in the upper layer 30. The distribution of the holes 34 may be random, quasi random, or according to a regular pattern. Within the local region in which holes 34 are formed, the holes 34 occupy an insubstantial amount of the area. For example, the holes 34 may be formed in the region where the proof mass 10 and teeth 14 are to be formed. In one embodiment, the holes 34 occupy less than 5% of the area of the region of the upper layer 30 in which they are formed. In another embodiment, the holes 34 occupy less than 2% of the region of the portion of the upper layer 30 in which they are formed. In another embodiment, the holes 34 occupy less than 1% of the area of the region of the upper layer 30 in which they are formed.

The holes 34 are typically formed by deep reactive ion etching (DIRE) or like process. The holes 34 and the projections 18, 22 may be formed prior to forming of the outline of the proof mass 10 and the teeth 14, 16, as shown in FIG. 4B. Alternatively, the process used to form the holes 34 may simultaneously form the proof mass 10 and the teeth 14, 16, as shown in FIG. 4C. The holes 34 may also be formed after formation of one or more of the proof mass 10 and teeth 14, 16.

Figure 5:
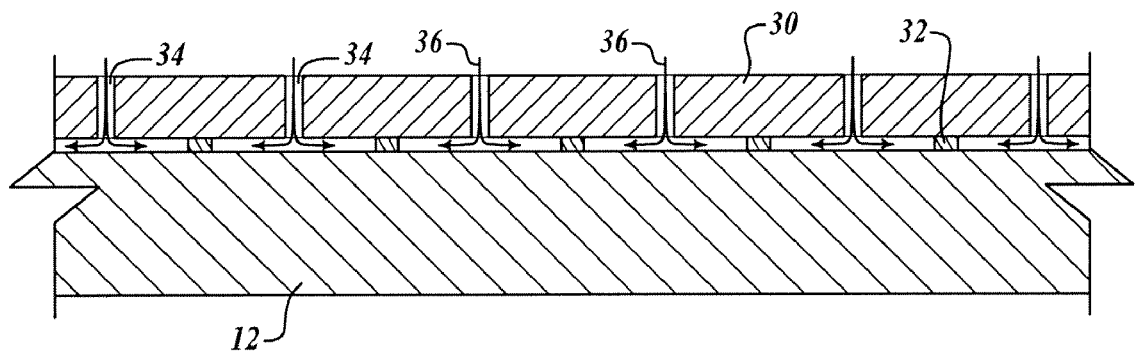
FIG. 5 is a side cross-sectional view of the layers of FIGS. 4A-4C having a portion of the intermediate layer removed.

Referring to FIG. 5, a substance 36 suitable for removing the intermediate layer 32 without substantially removing the upper layer 30, the substrate 12, or both, is then introduced through the holes 34. The substance 36 may be an oxide etchant such as a buffered oxide etchant (BOE) or a hydrogen fluoride (HF). HF is typically used at a concentration of about 49%. In an alternative embodiment, the substance 36 introduced is suitable for the intermediate layer and one or both of the substrate 12 and the upper layer 30, however, the substance 36 removes the substrate 12, upper layer 30, or both at a much slower rate than the substance 36 removes the intermediate layer 32. The substance 36 is maintained in contact with the intermediate layer 32 for sufficient time to remove all but small portions of the intermediate layer 30 located between the holes 34. The small portion of the intermediate layer 32 corresponds to the size and location of the projections 18, 22 to be formed in the finished device.

Figure 6A:
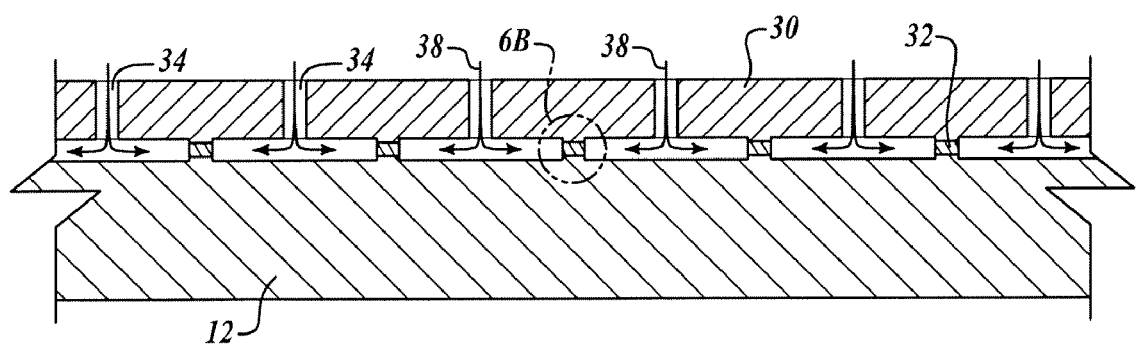
FIGS. 6A and 6B are side cross-sectional views illustrating the formation of projections, in accordance with an embodiment of the present invention.
Figure 6B:
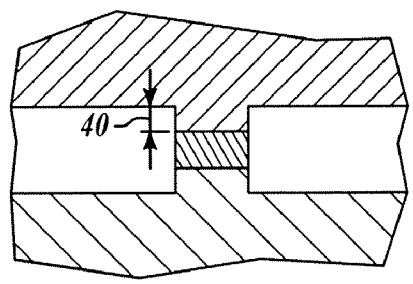

Referring to FIGS. 6A and 6B, a substance 38 is introduced that is effective to remove the upper layer 30, the substrate 12, or both is then introduced through the holes 34. In some embodiments, the substance 38 is not effective, or not substantially effective, to remove the intermediate layer 32. In the illustrated embodiment, a substance 38 effective to remove silicon is used such as potassium hydroxide (KOH) at high concentrations. At low temperatures, KOH will etch silicon very slowly while not substantially etching silicon oxide. The substance 38 is typically maintained in contact with the substrate 12 and upper layer 30 for sufficient time to remove a very small amount of material to a depth 40. The depth 40 of material removed is typically chosen to be approximately equal to the height 26a, 26b of the projections 18, 22 of the final device.

Inasmuch as the substance 38 removes material from all exposed areas of the substrate 12 and upper layer 30, the substrate 12 and upper layer 30 are sized such that the final size after the application of the substance 38 is suitable for an intended application. In instances where the mass 10 and teeth 14 are formed prior to the formation of the projections 18, 22, the teeth 14 and mass 10 will be formed somewhat larger to compensate for material removed by the substance 38. In the preferred embodiment, the depth 40 of material removed is from about 0.2 to 1 μm.

Figure 7:
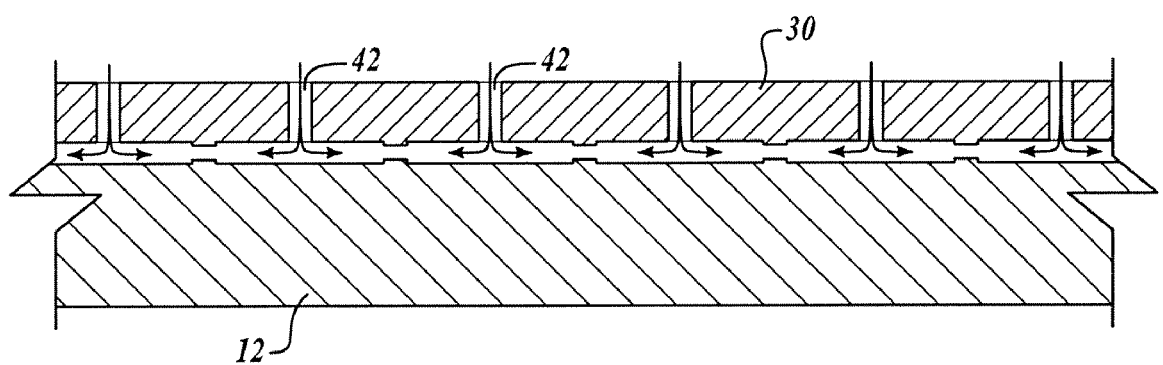
FIG. 7 is a side cross-sectional view of the layers of FIG. 3 having portions of the intermediate layer located adjacent the projections removed.

Referring to FIG. 7, all, or substantially all, of the intermediate layer 32 remaining between the projections 18, 22 is then removed to form a gap between the upper layer 30 and the substrate 12. This is typically accomplished by introducing a substance 42, similar to substance 36, suitable for removing the intermediate layer 32. The substance 42 may remain in contact with the intermediate layer 32 for no longer, or not substantially longer, than sufficient to remove the portion of the intermediate layer 32 between the projections 18, 22 such that substantial portions of the intermediate layer 32 remain to support structures formed in the upper layer 30 that are rigidly secured to the substrate 12. The substance 42 is typically ineffective to remove the upper layer 30, the substrate 12, or both. Alternatively, the substance 42 removes the upper layer 30 and/or the substrate 12 at a substantially slower rate than the intermediate layer 32. In the illustrated embodiment, the substance 42 is a substance suitable for removing silicon oxide, such as HF (e.g. at a 49% concentration), a BOE or the like.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A method for forming a Micro electromechanical (MEM) device comprising:
   placing an intermediate layer on a first layer;
   placing a second layer on the intermediate layer;
   forming a plurality of holes in the second layer;
   removing a first portion of the intermediate layer through the plurality of holes, a second portion of the intermediate layer remaining in discrete areas;
   removing a portion of the first and second layer not abutting the discrete areas to form projections abutting the discrete areas; and
   removing the second portion of the intermediate layer through the plurality of holes.

2. The method of claim 1, wherein the intermediate layer includes a first material and wherein the second layer includes a second material different than the first material and wherein removing the first portion comprises introducing a first substance effective to remove the first material and not substantially remove the second material.

3. The method of claim 2, wherein the first material is silicon oxide, the second material is silicon, and wherein the first substance is at least one of a buffered oxide etchant and hydrogen fluoride (HF).

4. The method of claim 2, wherein removing a portion of at least one of the first or second layers comprises introducing a second substance effective to remove at least one of the second material and a material forming the first layer.

5. The method of claim 4, wherein the first material is silicon oxide, the second material is silicon, and wherein the second substance is potassium hydroxide.

6. The method of claim 4, wherein the second substance is not effective to substantially remove the first material.

7. The method of claim 1, wherein the second layer comprises silicon.

8. The method of claim 7, wherein forming the plurality of holes comprises performing deep reactive ion etching.

9. The method of claim 1, further comprising forming an operative structure mounted to the first layer in the second layer.

10. The method of claim 9, wherein the operative structure is a mass resiliently mounted to the first layer having a gap between the mass and the substrate, the method further comprising forming a structure rigidly mounted to the first layer in the second layer.

11. The method of claim 9, wherein a portion of the operative structure is formed simultaneously with formation of the plurality of holes.

12. The method of claim 9, wherein the operative structure includes a comb drive.

13. The method of claim 1, wherein the plurality holes occupy an insubstantial amount of the region of the second layer in which they are formed.

14. The method of claim 13, wherein the plurality of holes occupy less than 5% of the area of the region of the second layer in which they are formed.

15. The method of claim 13, wherein the plurality of holes occupy less than 2% of the area of the region of the second layer in which they are formed.

16. The method of claim 1, wherein the projections have a height that is less than 5% of a separation between portions of the first and second layers adjacent the projections.

17. The method of claim 16, wherein the projections have a height that is less than 1% of a separation between portions of the first and second layers adjacent the projections.

18. A method for forming a MEM device comprising:
   forming a silicon oxide layer on a silicon substrate;
   forming an upper silicon layer on the silicon oxide layer;
   forming a plurality of holes in the upper silicon layer;
   introducing an oxide etchant removing silicon oxide but not substantially removing silicon through the plurality of holes;
   removing the oxide etchant after a first time period sufficient to remove all but isolated areas of the silicon oxide layer;
   introducing a silicon etchant removing the exposed silicon substrate and upper silicon layer but substantially not removing the silicon oxide through the plurality of holes;
   removing the silicon etchant after a second time period sufficient to remove a thin outer layer of the upper silicon layer and substrate; and
   introducing a second oxide etchant again to remove the isolated areas of the silicon oxide layer.

19. The method of claim 18, further comprising forming a mass resiliently mounted to the substrate in the upper layer and having a gap between the mass and the substrate.

20. The method of claim 19, wherein forming a plurality of holes comprises forming deep reactive ion etching.

* * * * *